(12) United States Patent
Onishi

(10) Patent No.: US 9,182,442 B2
(45) Date of Patent: Nov. 10, 2015

(54) SEMICONDUCTOR MODULE

(71) Applicant: Yukio Onishi, Nagoya (JP)

(72) Inventor: Yukio Onishi, Nagoya (JP)

(73) Assignee: TOYOTA JIDOSHA KABUSHIKI KAISHA, Tokyo (JP)

( * ) Notice: Subject to any disclaimer, the term of this patent is extended or adjusted under 35 U.S.C. 154(b) by 56 days.

(21) Appl. No.: 13/957,996

(22) Filed: Aug. 2, 2013

(65) Prior Publication Data

US 2014/0043058 A1 Feb. 13, 2014

(30) Foreign Application Priority Data

Aug. 9, 2012 (JP) ................................. 2012-177488

(51) Int. Cl.
*G01R 31/02* (2006.01)
*G01R 31/26* (2014.01)
*G01R 31/327* (2006.01)
*G01R 31/42* (2006.01)

(52) U.S. Cl.
CPC .............. *G01R 31/26* (2013.01); *G01R 31/025* (2013.01); *G01R 31/3271* (2013.01); *G01R 31/42* (2013.01)

(58) Field of Classification Search
CPC ................ G01R 31/26–31/275; G01R 31/025; G01R 31/3271; B60L 3/0023; B60L 3/0069
USPC ........... 324/762.01, 762.08–762.09, 415–423
See application file for complete search history.

(56) References Cited

U.S. PATENT DOCUMENTS

| | | | |
|---|---|---|---|
| 2004/0008530 A1* | 1/2004 | Kitahata et al. | 363/131 |
| 2005/0146374 A1* | 7/2005 | Sumita | 327/534 |
| 2005/0231172 A1* | 10/2005 | Kato et al. | 320/166 |
| 2006/0186946 A1* | 8/2006 | Hughes | 327/427 |
| 2007/0109006 A1* | 5/2007 | Klass et al. | 324/765 |
| 2009/0115355 A1* | 5/2009 | Oyobe et al. | 318/34 |
| 2011/0025369 A1* | 2/2011 | Quarto | 324/765.01 |
| 2011/0068818 A1 | 3/2011 | Fukami | |

FOREIGN PATENT DOCUMENTS

| | | |
|---|---|---|
| JP | A-9-257870 | 10/1997 |
| JP | A-2003-294807 | 10/2003 |
| JP | 2006320176 A * | 11/2006 |
| JP | A-2011-71174 | 4/2011 |

* cited by examiner

*Primary Examiner* — Patrick Assouad
*Assistant Examiner* — Demetrius Pretlow
(74) *Attorney, Agent, or Firm* — Oliff PLC

(57) ABSTRACT

A semiconductor module is provided in a power system of an apparatus. The semiconductor module includes a semiconductor switch, a voltage applying device configured to apply a first voltage that is equal to or higher than a rated voltage of the apparatus to the semiconductor switch in an off-state in a case where the apparatus is not in practical use, and a leak detecting circuit configured to detect a leak current from the semiconductor switch. The rated voltage of the apparatus is a rated voltage when the apparatus is in practical use.

9 Claims, 7 Drawing Sheets

SEMICONDUCTOR MODULE

CROSS-REFERENCE TO RELATED APPLICATION

This application claims priority to Japanese Patent Application No. 2012-177488 filed on Aug. 9, 2012, the contents of which are hereby incorporated by reference into the present application.

TECHNICAL FIELD

A technique described herein relates to a semiconductor module.

DESCRIPTION OF RELATED ART

Semiconductor switches are used as switching elements in a power system of an apparatus. Devices and circuits are known which are configured to diagnose possible degradation of semiconductor switches used for the power system of the apparatus. For example, Japanese Patent Application Publication No. 2003-294807 describes a device which is connected, during a periodic inspection or the like, to a semiconductor switch to be measured and applies a measurement voltage to the semiconductor switch to diagnose possible degradation.

SUMMARY

A power system of a conventional apparatus generally includes no circuit for diagnosing possible degradation of semiconductor switches, and thus, an apparatus for degradation diagnosis is used to diagnose possible degradation during inspection as is the case with Japanese Patent Application Publication No. 2003-294807. This precludes possible degradation of a semiconductor switch from being immediately determined.

A semiconductor module disclosed herein is provided in a power system of an apparatus. The semiconductor module includes a semiconductor switch, a voltage applying device configured to apply a first voltage that is equal to or higher than a rated voltage of the apparatus to the semiconductor switch in an off-state in a case where the apparatus is not in practical use, the rated voltage of the apparatus being a rated voltage when the apparatus is in practical use, and a leak detecting circuit configured to detect a leak current from the semiconductor switch.

In this semiconductor module, when the apparatus is not in practical use, the leak current from the semiconductor switch can be detected by applying the voltage to the semiconductor switch in the off-state. Thus, possible degradation can be immediately determined. Furthermore, the voltage equal to or higher than the rated voltage for the apparatus in practical use is applied to the semiconductor switch. Consequently, possible degradation can be reliably detected.

DETAILED DESCRIPTION OF EMBODIMENT

Figure 1:
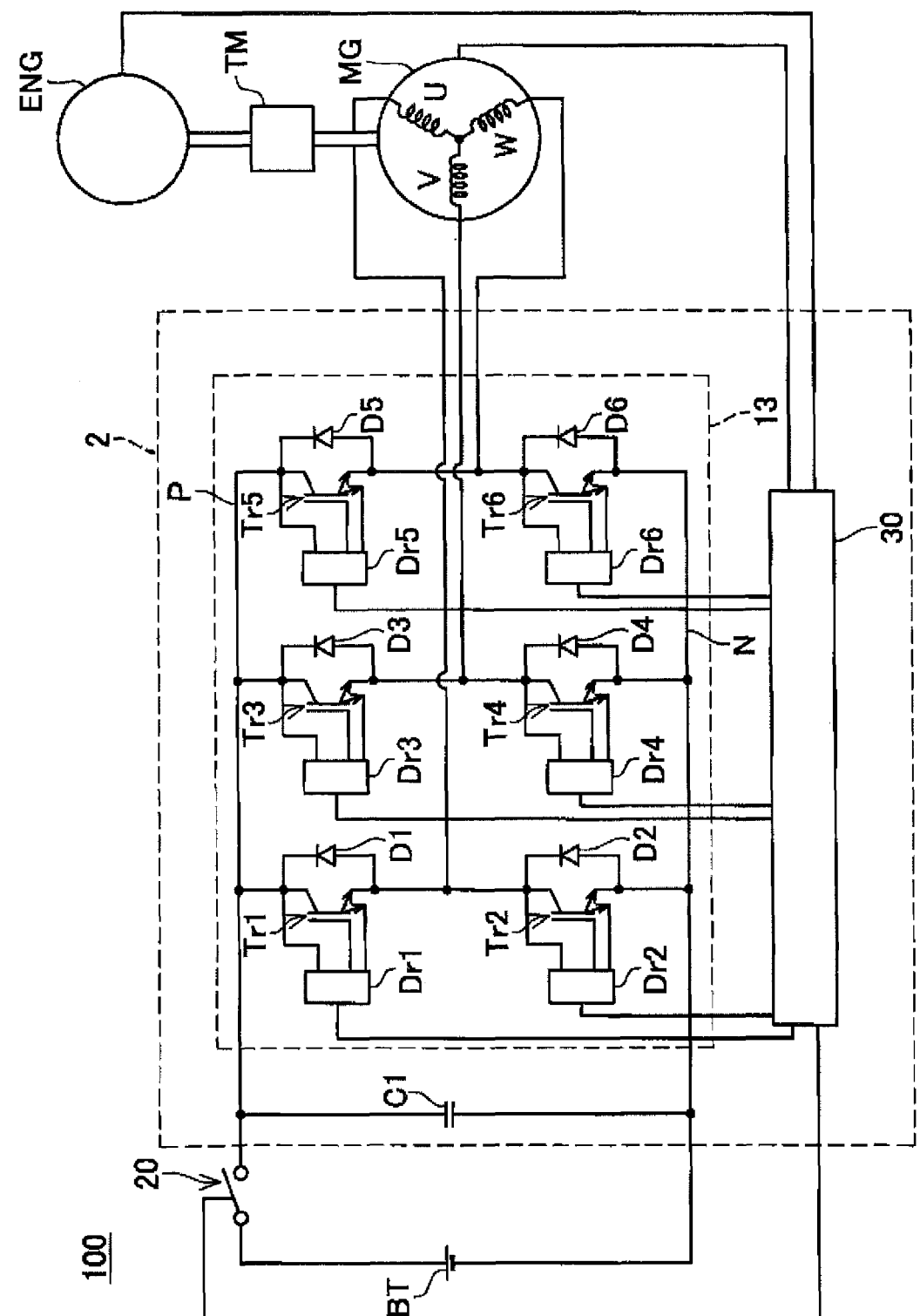
FIG. 1 is a schematic circuit diagram a power system of a hybrid car according to Embodiment 1.

A semiconductor module disclosed therein is provided in a power system of an apparatus, for example, a transportation apparatus such as a car, an industrial apparatus, or an electric apparatus. A state in which the apparatus is in practical use means that the apparatus is energized and actually used. For example, if the apparatus is, though not limited to, a car, the practical use state corresponds to a state in which the apparatus is energized and is in a vehicle operation mode. More specifically, a state where an ignition of the car is on corresponds to the practical use state, and a state where an ignition of the car is off does not correspond to the practical use state. The semiconductor module disclosed herein carries out leak detection when the apparatus is not in practical use. Thus, a configuration used when the apparatus is in practical use may be used for leak detection, allowing the semiconductor module to be prevented from being excessively complicated for leak detection.

The leak detection may be carried out when the apparatus is not in practical use, and timings for the leak detection, the number of times that the leak detection is executed, the frequency of the leak detection, and the like may be optionally set. For example, the leak detection may be carried out exclusively when the practical use of the apparatus ends or carried out when the apparatus not in practical use further meets a predetermined condition. Alternatively, the leak detection may be intermittently carried out at pre-determined intervals while the apparatus is not in practical use. Alternatively, the leak detection may be carried out in response to an input from a user of the apparatus or the like when the apparatus is not in practical use.

A semiconductor switch provided in the semiconductor module is not limited but may be, for example, a transistor such as an IGBT or a MOSFET. When the semiconductor switch is a large-capacity power semiconductor, a technique disclosed herein may preferably be used.

Any voltage applying device may be used to apply a first voltage to the semiconductor switch during the leak detection provided that voltage applying device may apply the first voltage equal to or higher than a rated voltage applied to the semiconductor switch when the apparatus is in practical use. The voltage applying device applying the first voltage to the semiconductor switch during the leak detection may be identical to or separate from a voltage applying device used when the apparatus is in practical use. The first voltage applied to the semiconductor switch by the voltage applying device when the apparatus is not in practical use is preferably higher than the rated voltage for the apparatus in practical use (a so-called system rated voltage) and lower than an element rated voltage for the semiconductor switch. The leak detection can be carried out with a higher voltage applied to a degree that the accepted semiconductor switch is prevented from being destroyed, and thus, possible degradation of the semiconductor switch can be more reliably detected.

In the semiconductor module, the apparatus may include a generator, and the semiconductor module may include a controller configured to operate the generator. Moreover, the voltage applying device may be a smoothing capacitor connected to the semiconductor switch, and the controller may operate the generator to accumulate charge in the smoothing capacitor and use the accumulated charge to apply the first voltage to the semiconductor switch. Thus, the first voltage equal to or higher than the rated voltage applied to the apparatus in practical use may be applied to the semiconductor switch during the leak detection without provision of a separate voltage applying device for the leak detection. The generator may be a motor generator.

The controller may operate the generator to accumulate the charge in the smoothing capacitor in the case where the apparatus is not in practical use, and the smoothing capacitor may use the accumulated charge to apply the voltage to the semiconductor switch.

The semiconductor module may include both an upper arm side semiconductor switch and a lower arm side semiconductor switch, and each of the upper arm side semiconductor switch and the lower arm side semiconductor switch may include a main region and a sense region configured to detect a current which flows in the main region. In this case, the voltage applying device may apply the first voltage to one of the upper arm side semiconductor switch and the lower arm side semiconductor switch that is in an off-state, in a case where the sense region of the other of the upper arm side semiconductor switch and the lower arm side semiconductor switch that is in an on-state is connected to the leak detecting circuit. For example, when the first voltage is applied to the upper am side semiconductor switch and a leak current flows from the upper arm side semiconductor switch, a current flows from the sense region of the opposite lower arm side semiconductor switch to the leak detecting circuit, which can detect the leak current from the upper arm side semiconductor switch. A circuit for detecting the current in the main region of each semiconductor switch may be utilized as the leak detecting circuit, thus eliminating a need to install a circuit dedicated to leak detection.

The controller configured to operate the generator may turn on and off the semiconductor switch in a controllable manner. When the semiconductor module includes the controller and both the upper arm side semiconductor switch and the lower arm side semiconductor switch, and each of the upper arm side semiconductor switch and the lower arm side semiconductor switch includes the main region and the sense region configured to detect a current which flows in the main region, the controller may operate the generator to accumulate charge in the smoothing capacitor, control one of the upper arm side semiconductor switch and the towel arm side semiconductor switch to be in the on-state and the other of the upper arm side semiconductor switch and the lower arm side semiconductor switch to be in the off-state, and apply the first voltage to the other of the upper arm side semiconductor switch and the lower arm side semiconductor switch that is in the off-state by using the charge accumulated in the smoothing capacitor in a state in which the sense region of the one of the upper arm side semiconductor switch and the lower arm side semiconductor switch that is in the on-state is connected to the leak detecting circuit.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor modules.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiment 1

FIG. 1 shows a schematic circuit diagram of a power system of a hybrid car 100 according to Embodiment 1. The hybrid car 100 includes a semiconductor module 2, a battery BT, a motor generator MG, and an engine ENG. The semiconductor module 2 is electrically connected to the battery BT and the motor generator MG. The battery BT is a rechargeable secondary battery. The motor generator MG is a three-phase AC type and includes coils U, V, and W connected together in a delta form. The motor generator MG is mechanically connected to the engine ENG via a power transmitter TM. The power transmitter TM is a gear unit which distributes and merges power from the engine ENG and power from the motor generator MG and which transmits the resultant power to an axle WA. Appropriate control of the power transmitter TM allows the hybrid car 100 to travel using only the engine ENG, only the motor generator MG, or the total force of the power from the engine ENG and the power from the motor generator MG. Furthermore, the hybrid car 100 can utilize the kinetic energy of the vehicle during braking to drive the motor generator MG from an output side, thus generating electric power to charge the battery BT.

The semiconductor module 2 includes an inverter 13, a capacitor C1, and a controller 39 A high potential side of the battery BT is connected to an input end of the inverter 13 via a cutout relay 20. The inverter 13 includes six transistors Tr1 to Tr6, six diodes D1 to D6 (reflux diodes) connected to the transistors Tr1 to Tr6 respectively, and six drivers Dr1 to Dr6. The drivers Dr1 to Dr6 can switch on and off the transistors Tr1 to Tr6. The inverter 13 is of a three-phase type and includes three sets each of two transistors connected together in parallel as shown in FIG. 1. As is well known, a line passing through the high-potential side transistors Tr1, Tr3, and Tr5 is referred to as an "upper arm", and a line passing through the low-potential side transistors Tr2, Tr4, and Tr6 is referred to as a "lower arm". Furthermore, a common high-potential line through which power is supplied to the upper arm is sometimes referred to as a P line, and a low-potential line common to the lower upper arm is sometimes referred to as an N line. The N line is connected directly to a low-potential terminal of the battery BT. The controller 30 is connected to the motor generator MG, the engine ENG, the cutout relay 20, and the drivers Dr1 to Dr6 in a controllable manner.

Each of the transistors Tr1 to Tr6 has a main region and a sense region that allow a current in the main region to be detected. The main region and the sense region are formed on the same semiconductor substrate. An IGBT element is formed in each of the main region and the sense region. The main region and the sense region share a gate terminal and a collector terminal and have different emitter terminals. The collector terminal, and gate terminal and the emitter terminal of the sense region of each of the transistors Tr1 to Tr6 are connected to a corresponding one of the drivers Dr1 to Dr6. The emitter terminals of the main regions of the upper arm side transistors Tr1, Tr3, and Tr5 and the collector terminals of the lower arm side transistors Tr2, Tr4, and Tr6 are connected together, respectively. Connection points (output ends of the inverter 13) between the upper arm side and the lower arm side are connected to the coils U, V, and W, respectively, of the motor generator MG.

Typically, an output voltage from the battery BT is about 200 V and is increased by a booster circuit (not shown in the drawings). When the hybrid car 100 is in practical use and a potential difference between the P line and the N line is denoted by VH, the VH is about 600 V to about 700 V. When the hybrid car 100 is in practical use, a system rated potential applied to the transistors Tr1 to Tr6 is about 600 V to about 700 V. In this case, the transistors Tr1 to Tr6 may be power semiconductors with an element rated voltage of 1,200 V to 1,400 V. When power is supplied to the motor generator MG for operation, an output from the inverter 13 is supplied to the motor generator MG. Each set of two transistors connected in series outputs AC power for a corresponding one of the three phases U, V, and W.

The capacitor C1 is connected between the battery BT and the inverter 13 and in parallel with the battery BT and the inverter 13. The capacitor C1 is provided at the input end of the inverter 13 to smooth an input current to the inverter 13. The semiconductor module 2 operates a motor for operating the vehicle and thus handles a large current. Thus, the capacitor C1 has a large capacitance. Although not shown in the drawings, the semiconductor module 2 may further include a discharge circuit for discharging the capacitor C1.

Figure 2:
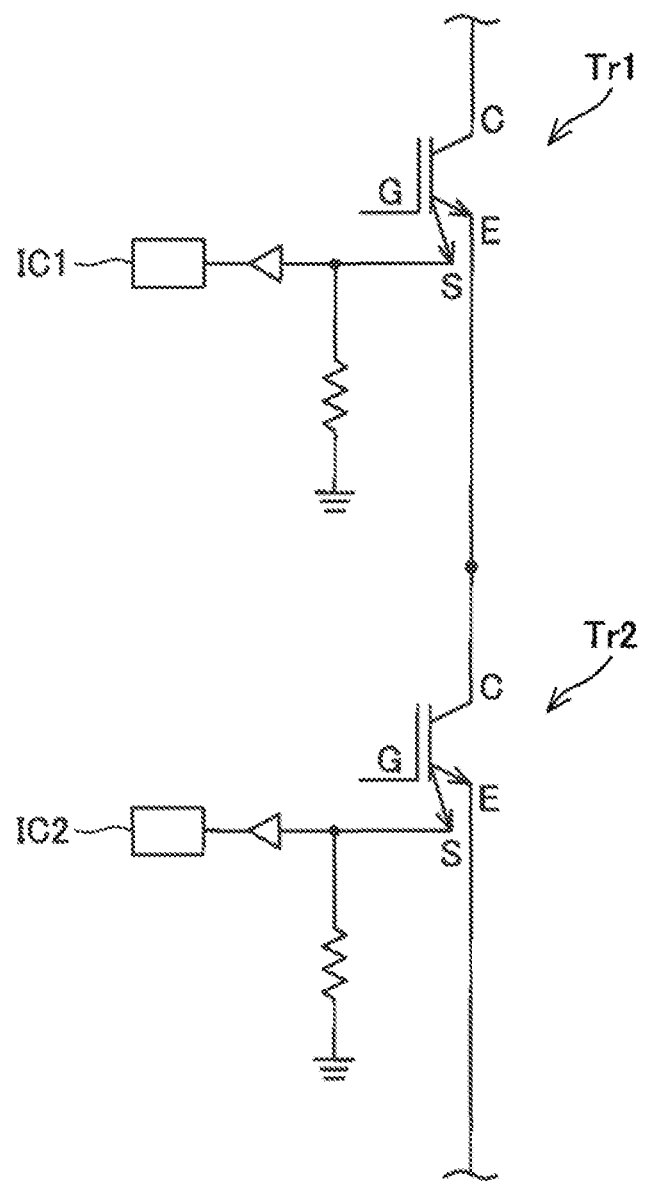
FIG. 2 is a circuit diagram showing the circuit diagram in FIG. 1 in detail.
Figure 3:
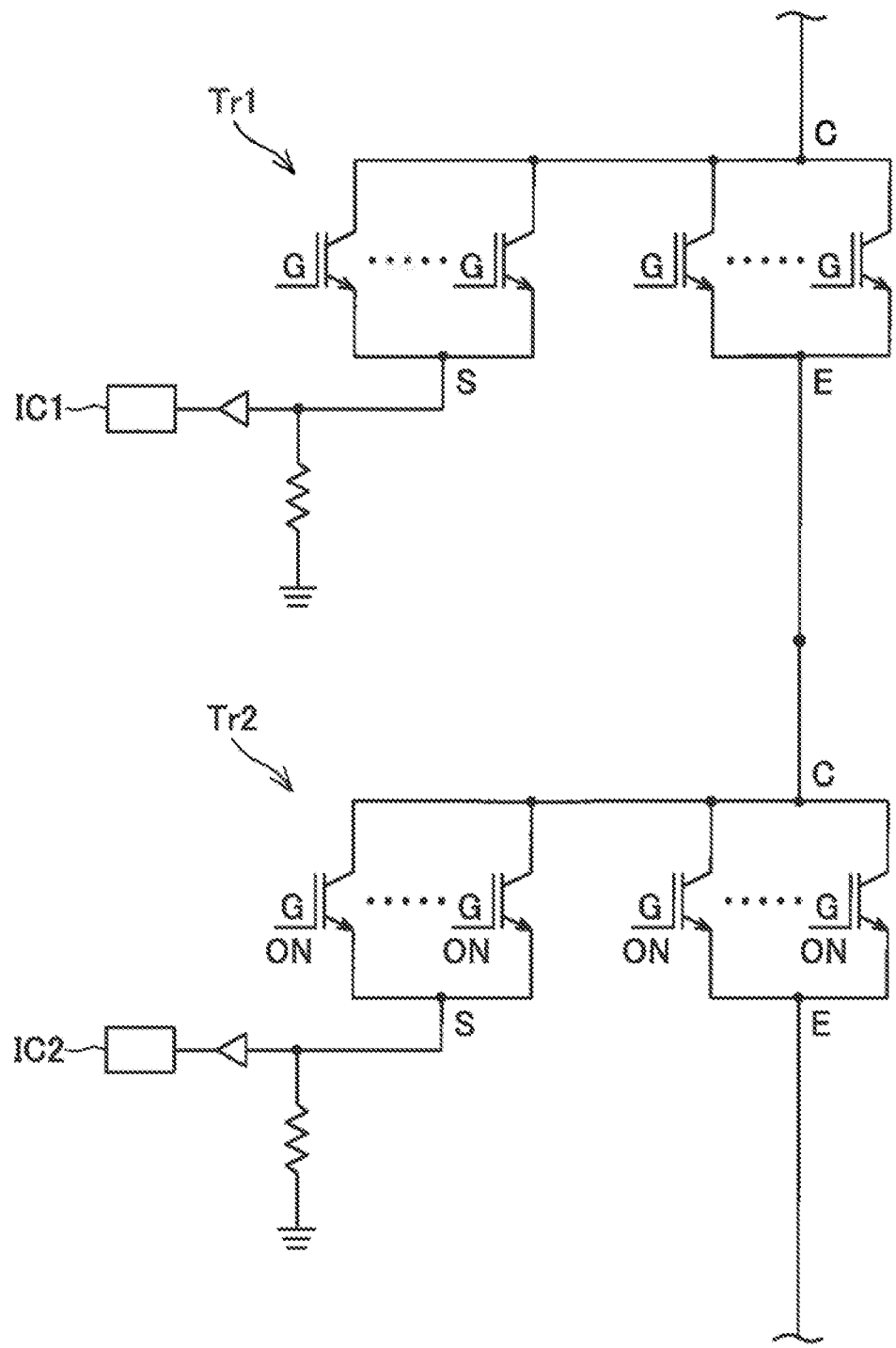
FIG. 3 is an equivalent circuit diagram of FIG. 2.

FIG. 2 is a diagram showing how the transistors Tr1 and Tr2 are connected together in further detail. FIG. 3 is a diagram showing an equivalent circuit of the transistors Tr1 and Tr2, In FIGS. 2 and 3, the gate terminal and the collector terminal are denoted by G and C, respectively, and the emitter terminal of the main region and the emitter terminal of the sense region are denoted by E and S, respectively. Integrated circuits IC1 and IC2 are voltage monitoring ICs and are built in the drivers Dr1 and Dr2. The emitter terminals of the sense regions of the transistors Tr1 and Tr2 are connected to the integrated circuits IC1 and IC2, respectively, via respective voltage converters. Each of the integrated circuits IC1 and IC2 allows a current flowing through the sense region to be detected. The emitter terminal of the sense region is further grounded via a resistor. As shown in FIG. 3, several ten thousand IGBT cells are connected together in parallel and to the semiconductor substrate for the transistors Tr1 and Tr2, and about one-ten thousandths ($1/10000$) of the IGBT cells are used as the sense regions. The main region and the sense region are connected together on a collector terminal side, while, on an emitter terminal side, the emitter terminal of the sense region is connected to the integrated circuit IC1 or IC2 without being connected to the emitter terminal of the main region. Each of the integrated circuits IC1 and IC2 allows a current flowing through the sense region to be detected. When the hybrid car 100 is in practical use, each of the integrated circuits IC1 and IC2 is used to detect a value of a current flowing through the main region of a corresponding one of the transistors Tr1 and Tr2.

Figure 4:
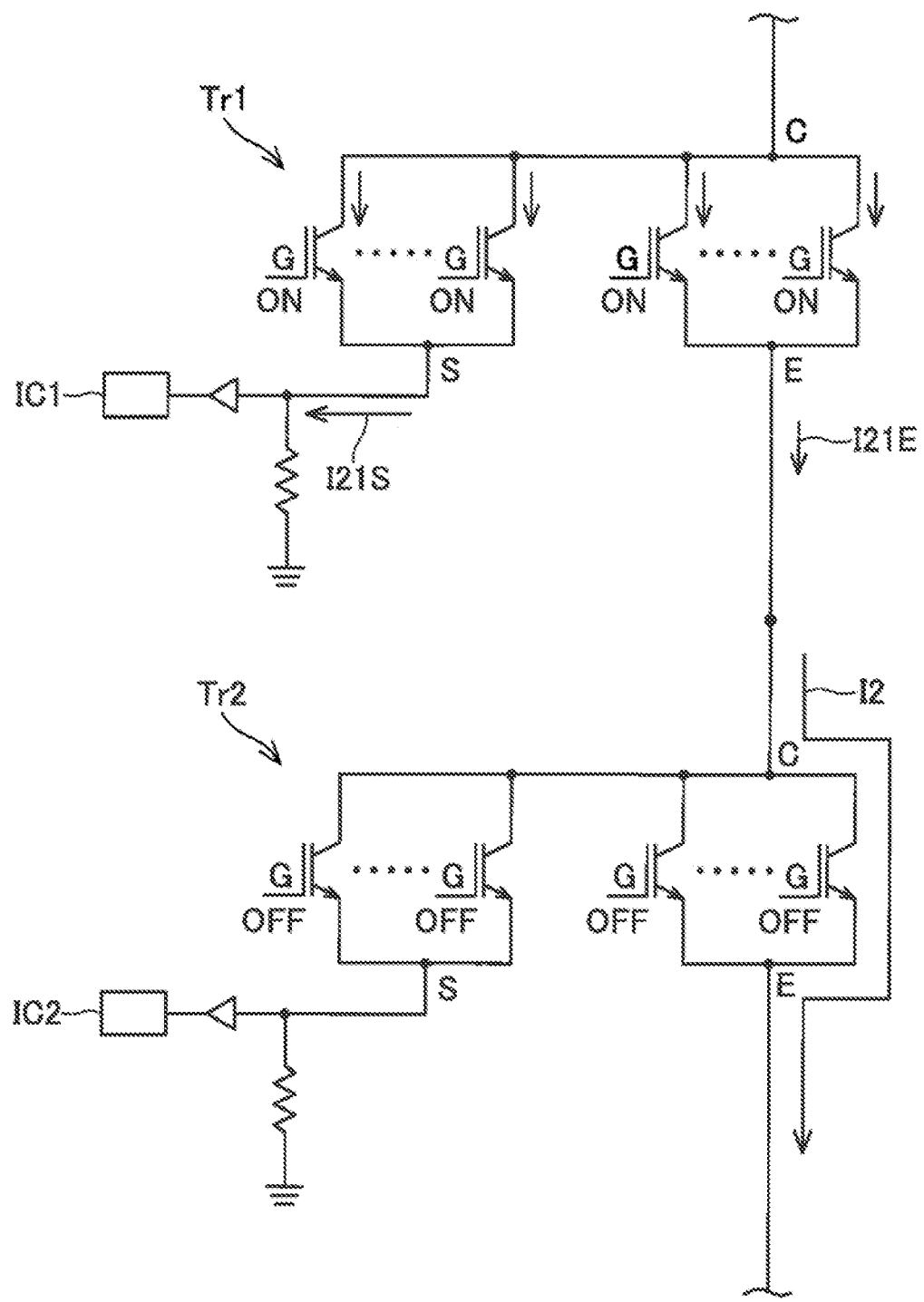
FIG. 4 is a diagram showing a current flowing through the circuit in FIG. 2.

Leak detection for the transistor Tr2 can be carried out by setting the transistors Tr2 to Tr6 to an off-state, setting a gate of the upper arm side transistor Tr1 to an on-state, and applying a high voltage to between the collector terminal side of the transistor Tr1 and the emitter terminal side of the transistor Tr2. As shown in FIG. 4, when a leak current I2 flows through the transistor Tr2 on the lower arm side, a current I21E flows through the main region of the transistor Tr1 on the opposite upper arm side, and a current I21S flows through the sense region of the transistor Tr1. The current I21S is converted by the voltage converter, and the resultant voltage is input to the integrated circuit IC1. The integrated circuit IC1 allows the leak current I2 from the transistor Tr2 to be detected.

Figure 5:
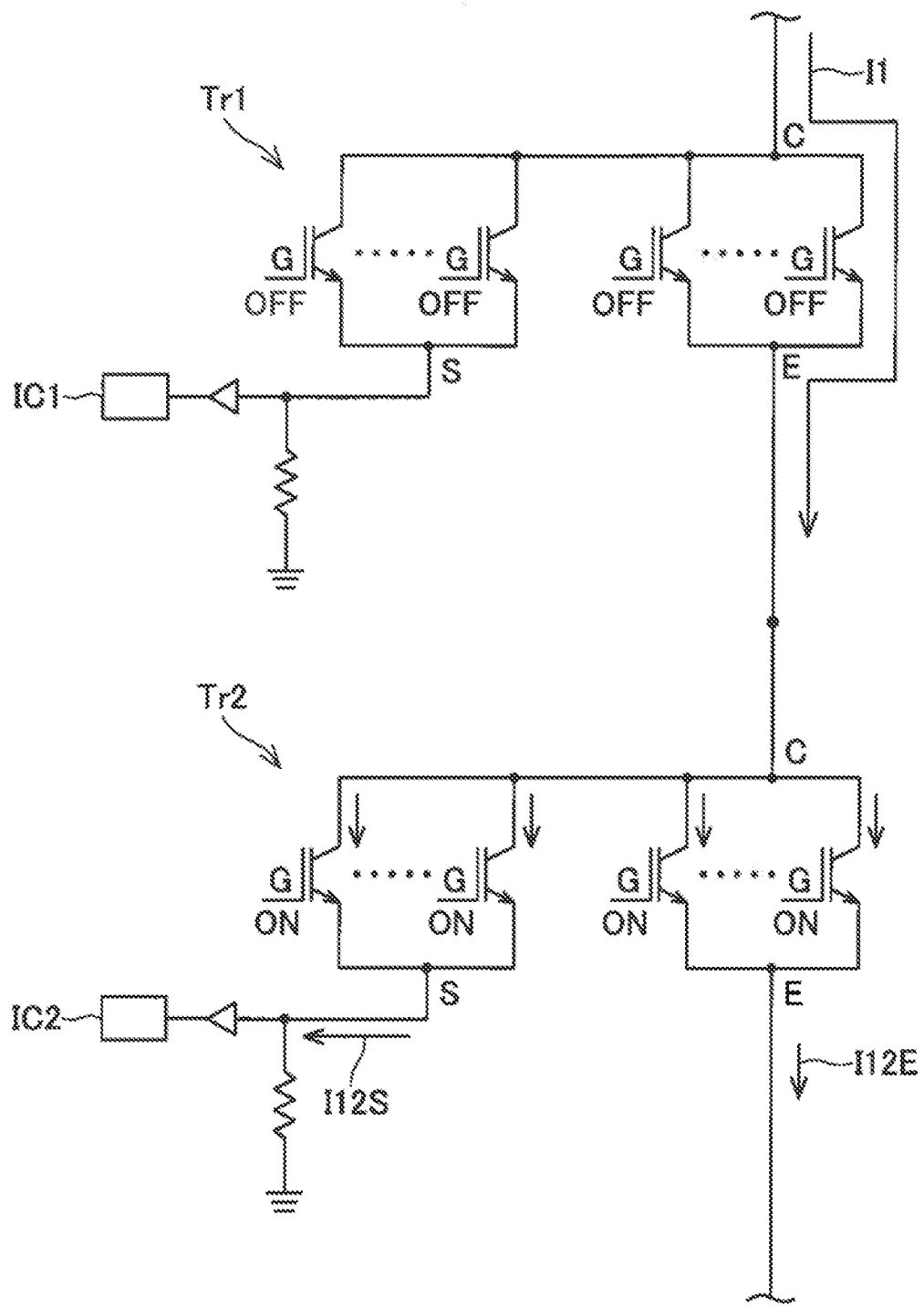
FIG. 5 is a diagram showing a current flowing through the circuit in FIG. 2.

Leak detection for the transistor Tr1 can be carried out by setting the transistors Tr1 and Tr3 to Tr6 to the off-state, setting a gate of the lower arm side transistor Tr2 to the on-state, and applying a high voltage to between the collector terminal side of the transistor Tr1 and the emitter terminal side of the transistor Tr2. As shown in FIG. 5, when a leak current I1 flows through the upper arm side transistor Tr1, a current I12E flows through the main region of the opposite lower arm side transistor Tr2, and a current I12S flows through the sense region of the transistor Tr2, The current I12S is convened by the voltage converter, and the resultant voltage is input to the IC2. The IC2 allows the leak current I1 from the transistor Tr1 to be detected.

Figure 6:
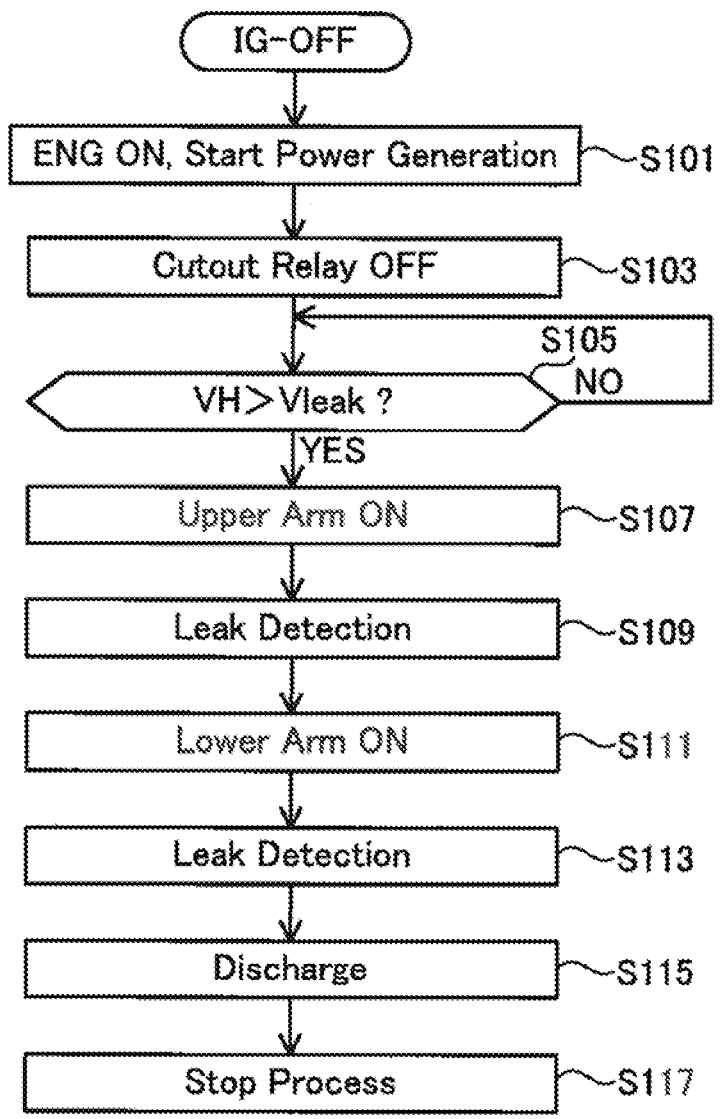
FIG. 6 is a flowchart of a process carried out when an ignition of the hybrid car is switched off according to Embodiment 1.

As shown in FIG. 6, the controller 30 determines that the hybrid car 100 is not in practical use when an ignition (IG) of the hybrid car is set to the off-state. To carry out leak detection, the controller 30 sets the engine ENG to the on-state. The controller 30 allows the engine ENG to operate the motor generator MG as a generator to start power generation (step S101). Subsequently, the controller 30 turns off the cutout relay 20 (step S103). Power generated by the motor generator MG allows charge to be accumulated in the capacitor C1, increasing the VH, which is indicative of the potential difference between the P line and the N line. The operation of the engine ENG and the power generation by the motor generator MG continue until the potential difference VH between the P line and the N line exceeds a leak detection voltage Vleak (step S105). The leak detection voltage Vleak is higher than a rated voltage of 600 V to 700 V applied to the transistors Tr1 to Tr6 when the ignition of the hybrid car 100 is switched on. Furthermore, the VH is lower than an element rated voltage for the transistors Tr1 to Tr6.

In step S107 to step S109, leak detection is carried out on each of the paired upper and lower arm side transistors connected together in series. The detection is carried out first on the transistors Tr1 and Tr2, then on the transistors Tr3 and Tr4, and subsequently on the transistors Tr5 and Tr6. Similar processing is carried out on each pair of transistors, and thus, only the leak detection for the transistors Tr1 and Tr2 will be described.

When VH>Vleak, the controller 30 controls Dr1 to Dr6 to set the transistors Tr2 to Tr6 to the off-state and to set the gate of the upper arm side transistor Tr1 to the on-state (step S107). Thus, the voltage VH is applied to between the collector terminal side of the transistor Tr1 and the emitter terminal side of the transistor Tr2 to start the leak detection for the lower arm side transistor Tr2.

Figure 7:
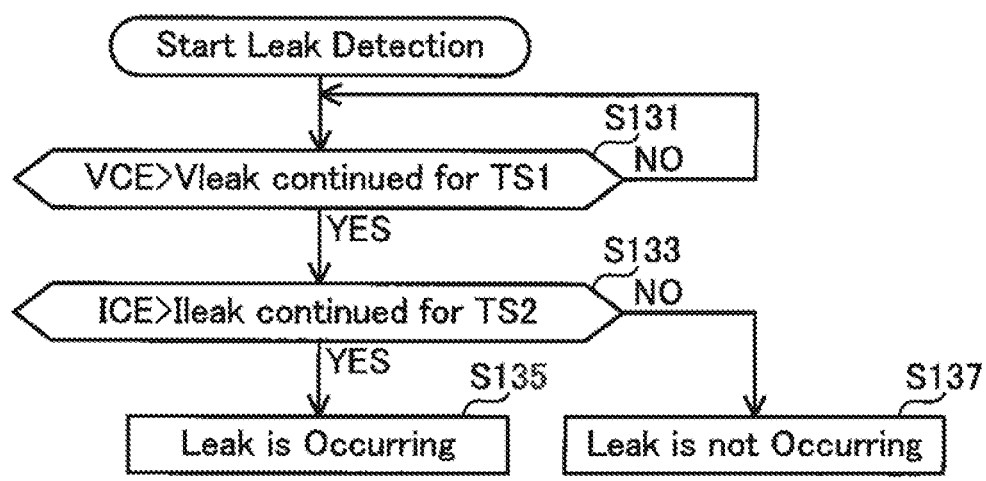
FIG. 7 is a flowchart of a leak detection process shown in FIG. 6.

FIG. 7 is a diagram showing a flow of leak detection carried out in steps S109 and S113 in detail. In step S131, if a voltage VCE between the collector and emitter of a detection target transistor remains higher than the Vleak for a detection permission time TS1, the leak detection is permitted to be carried out. The process then shifts to step S133. In step S133, if a current ICE between the collector and emitter of the detection target transistor remains larger than a leak detection current Ileak for a leak detection time TS2, the controller 30 determines that "leak is occurring" (step S135). If the condition in step S133 is not met, the controller 30 determines that "leak is not occurring" (step S137). As shown in FIG. 4, the current ICE between the collector and emitter of each of the transistors Tr1 and Tr2 is detected by the corresponding one of the IC1 and IC2 utilizing the sense region of each of the transistors Tr1 and Tr2 and output to the controller 30. The controller 30 then determines whether or not leak is occurring.

When the leak detection in step S109 in FIG. 6 ends, the process shifts to step S111. In step S111, the controller 30 controls the Dr1 to Dr6 to set the transistors Tr1 and Tr3 to Tr6 to the off-state and to set the gate of the lower arm side transistor Tr2 to the on-state. Thus, the voltage VH is applied to between the collector terminal side of the transistor Tr1 and the emitter terminal side of the transistor Tr2 to start the leak detection for the upper arm side transistor Tr1. As described above, in step S113, processing shown in FIG. 7 is carried out as is the case with step S109 to determine whether or not leak is occurring. As shown in FIG. 5, the current ICE between the collector and emitter of the transistor Tr1 is detected by the IC2 utilizing the sense region of the transistor Tr2. Alternatively, steps S111 and S113 may be changed to steps S107 and S109 to carry out the leak detection for the upper arm side transistor Tr1 earlier than the leak detection for the lower arm side transistor Tr2.

The leak detection is carried out on the transistors Tr3 to Tr6 by processing similar to the processing in steps S107 to S113. Then, the capacitor C1 is discharged (step S115). Subsequently, a stop process is carried out (step S117).

As described above, the semiconductor module 2 can apply the voltage to the transistors Tr1 to Tr6 to detect a possible leak current from the transistors Tr1 to Tr6 when the ignition of the hybrid car 100 is switched off. When the ignition of the hybrid can is switched off, the controller 30 executes the flow shown in FIG. 6 and FIG. 7 to enable a possible leak current from the transistors Tr1 to Tr6 to be detected, thus allowing possible degradation of the transistors Tr1 to Tr6 to be immediately determined.

Furthermore, the controller 30 operates the engine ENG and the motor generator MG, used for traveling of the hybrid car 100 and the like, to generate power, thus accumulating charge in the capacitor C1 for smoothing. The capacitor C1, provided for smoothing, can be utilized as a power applying device, and thus, no power applying device dedicated to leak detection needs to be installed. Furthermore, the charge accumulated in the capacitor C1 is used to apply the voltage higher than the rated voltage for an ignition-on state to the transistors Tr1 to Tr6 to an extent that the element rated voltage is not exceeded. Thus, possible degradation can be reliably detected. As a result, the leak detection can be carried out by applying a sufficient voltage for withstand voltage tests for the transistors Tr1 to Tr6, which are power semiconductors with an element rated value of more than 1,000 V.

Furthermore, each of the transistors Tr1 to Tr6 includes the main region and the sense region. For a pair of the upper arm side transistor and the lower arm side transistor (for example, the transistors Tr1 and Tr2), the controller 30 can utilize the sense region of a transistor on one side (for example, the transistor Tr1) to detect a possible leak current from a transistor on the opposite other side (for example, the transistor Tr2). The controller 30 can utilize the circuits (for example, the integrated circuits IC1 and IC2) for detecting the current flowing through the sense regions, as leak detecting circuits. Thus, no circuit dedicated to leak detection needs to be installed.

In FIG. 6, a series of flows start to be carried out when the ignition of the hybrid car 100 is switched off. However, the flows need not be carried out at this timing. For example, the flows may be periodically carried out while the ignition of the hybrid car 100 is off.

In the embodiment, the hybrid car 100 has been described by way of example. However, the technique disclosed herein can be widely utilized for transportation apparatuses such as cars, industrial apparatuses, electric apparatuses, and the like which have a power system with semiconductor switches.

What is claimed is:

1. A semiconductor module provided in a power system of an apparatus, the semiconductor module comprising:
   a semiconductor switch;
   a voltage applying device configured to apply a first voltage that is equal to or higher than a rated voltage of the apparatus to the semiconductor switch in an off-state in a case where the apparatus is not in practical use, the rated voltage of the apparatus being a rated voltage when the apparatus is in practical use; and
   a leak detecting circuit configured to detect a leak current of the semiconductor switch,
   wherein the first voltage which the voltage applying device applies to the semiconductor switch in a case where the apparatus is not in practical use is higher than the rated voltage of the apparatus when the apparatus is in practical use, and lower than a rated voltage of the semiconductor switch.

2. The semiconductor module of claim 1, wherein
   the apparatus includes a generator,
   the semiconductor module includes a controller configured to operate the generator,
   the voltage applying device is a smoothing capacitor connected to the semiconductor switch,
   the controller operates the generator to accumulate charge in the smoothing capacitor in a case where the apparatus is not in practical use, and
   the smoothing capacitor uses the accumulated charge to apply the first voltage to the semiconductor switch.

3. The semiconductor module of claim 2, wherein
   the semiconductor module includes both an upper arm side semiconductor switch and a lower arm side semiconductor switch,
   each of the upper arm side semiconductor switch and the lower arm side semiconductor switch comprises a main region and a sense region configured to detect a current which flows in the main region, and
   the voltage applying device applies the first voltage to one of the upper arm side semiconductor switch and the lower arm side semiconductor switch that is in an off-state, in a case where the sense region of the other of the upper arm side semiconductor switch and the lower arm side semiconductor switch that is in an on-state are connected to the leak detecting circuit.

4. The semiconductor module of claim 3, wherein
   the semiconductor module includes both an upper arm side semiconductor switch and a lower arm side semiconductor switch,
   each of the upper arm side semiconductor switch and the lower arm side semiconductor switch comprises a main region and a sense region configured to detect a current of the main region, and
   in the case where the apparatus is not in practical use, the controller:
      operates the generator to accumulate charge in the smoothing capacitor, controls one of the upper arm side semiconductor switch and the lower arm side semiconductor switch to be in an on-state and the other of the upper arm side semiconductor switch and the lower arm side semiconductor switch to be in an off-state, and applies the first voltage to the other of the upper arm side semiconductor switch and the lower arm side semiconductor switch that is in the off-state by using the charge accumulated in the smoothing capacitor in a state in which the sense region of the one of the upper arm side semiconductor switch and the lower arm side semiconductor switch that is in the on-state are connected to the leak detecting circuit.

5. The semiconductor module of claim 2, wherein the semiconductor module includes both an upper arm side semiconductor switch and a lower arm side semiconductor switch, each of the upper arm side semiconductor switch and the lower arm side semiconductor switch comprises a main region and a sense region configured to detect a current of the main region, and in the case where the apparatus is not in practical use, the controller:
  operates the generator to accumulate charge in the smoothing capacitor,
  controls one of the upper arm side semiconductor switch and the lower arm side semiconductor switch to be in an on-state and the other of the upper arm side semiconductor switch and the lower arm side semiconductor switch to be in an off-state, and
  applies the first voltage to the other of the upper arm side semiconductor switch and the lower arm side semiconductor switch that is in the off-state by using the charge accumulated in the smoothing capacitor in a state in which the sense region of the one of the upper arm side semiconductor switch and the lower arm side semiconductor switch that is in the on-state are connected to the leak detecting circuit.

6. The semiconductor module of claim 1, wherein the semiconductor module includes both an upper arm side semiconductor switch and a lower arm side semiconductor switch, each of the upper arm side semiconductor switch and the lower arm side semiconductor switch comprises a main region and a sense region configured to detect a current which flows in the main region, and the voltage applying device applies the first voltage to one of the upper arm side semiconductor switch and the lower arm side semiconductor switch that is in an off-state, in a case where the sense region of the other of the upper arm side semiconductor switch and the lower arm side semiconductor switch that is in an on-state are connected to the leak detecting circuit.

7. An apparatus comprising:

a semiconductor switch;

a voltage applying device configured to apply a first voltage that is equal to or higher than a rated voltage of the apparatus to the semiconductor switch in an off-state in a case where the apparatus is not in practical use, the rated voltage of the apparatus being a rated voltage when the apparatus is in practical use;

a leak detecting circuit configured to detect a leak current of the semiconductor switch;

a generator; and a controller configured to operate the generator, wherein
  the voltage applying device is a smoothing capacitor connected to the semiconductor switch,
  the controller operates the generator to accumulate charge in the smoothing capacitor in a case where the apparatus is not in practical use, and
  the smoothing capacitor uses the accumulated charge to apply the first voltage to the semiconductor switch,
  wherein the first voltage which the voltage applying device applies to the semiconductor switch in a case where the apparatus is not in practical use is higher than the rated voltage of the apparatus when the apparatus is in practical use, and lower than a rated voltage of the semiconductor switch.

8. The apparatus of claim 7, wherein the apparatus includes both an upper arm side semiconductor switch and a lower arm side semiconductor switch, each of the upper arm side semiconductor switch and the lower arm side semiconductor switch comprises a main region and a sense region configured to detect a current which flows in the main region, and the voltage applying device applies the first voltage to one of the upper arm side semiconductor switch and the lower arm side semiconductor switch that is in an off-state, in a case where the sense region of the other of the upper arm side semiconductor switch and the lower arm side semiconductor switch that is in an on-state are connected to the leak detecting circuit.

9. The apparatus of claim 8, wherein the apparatus includes both an upper arm side semiconductor switch and a lower arm side semiconductor switch, each of the upper arm side semiconductor switch and the lower atm side semiconductor switch comprises a main region and a sense region configured to detect a current of the main region, and in the case where the apparatus is not in practical use, the controller:
  operates the generator to accumulate charge in the smoothing capacitor,
  controls one of the upper arm side semiconductor switch and the lower arm side semiconductor switch to be in an on-state and the other of the upper arm side semiconductor switch and the lower a in side semiconductor switch to be in an off-state, and
  applies the first voltage to the other of the upper arm side semiconductor switch and the lower arm side semiconductor switch that is in the off-state by using the charge accumulated in the smoothing capacitor in a state in which the sense region of the one of the upper arm side semiconductor switch and the lower arm side semiconductor switch that is in the on-state are connected to the leak detecting circuit.

\* \* \* \* \*

UNITED STATES PATENT AND TRADEMARK OFFICE
CERTIFICATE OF CORRECTION

| | |
|---|---|
| PATENT NO. | : 9,182,442 B2 |
| APPLICATION NO. | : 13/957996 |
| DATED | : November 10, 2015 |
| INVENTOR(S) | : Yukio Onishi |

It is certified that error appears in the above-identified patent and that said Letters Patent is hereby corrected as shown below:

On the title page, item (73) Assignee should read as follows:

(73) Assignee: TOYOTA JIDOSHA KABUSHIKI KAISHA, Toyota (JP).

Signed and Sealed this
Twenty-ninth Day of March, 2016

Michelle K. Lee
*Director of the United States Patent and Trademark Office*